(12) United States Patent
Botelho

(10) Patent No.: US 7,397,255 B2
(45) Date of Patent: Jul. 8, 2008

(54) MICRO KELVIN PROBES AND MICRO KELVIN PROBE METHODOLOGY

(75) Inventor: John Sousa Botelho, Fall River, MA (US)

(73) Assignee: Paricon Technology Corporation, Fall River, MA (US)

( * ) Notice: Subject to any disclaimer, the term of this patent is extended or adjusted under 35 U.S.C. 154(b) by 86 days.

(21) Appl. No.: 11/425,490

(22) Filed: Jun. 21, 2006

(65) Prior Publication Data

US 2006/0290363 A1 Dec. 28, 2006

Related U.S. Application Data

(60) Provisional application No. 60/692,815, filed on Jun. 22, 2005.

(51) Int. Cl.
*G01R 31/02* (2006.01)
(52) U.S. Cl. .................... 324/755; 324/719; 324/765
(58) Field of Classification Search ............... None
See application file for complete search history.

(56) References Cited

U.S. PATENT DOCUMENTS

| | | | | |
|---|---|---|---|---|
| 4,764,026 A * | 8/1988 | Powell et al. | | 374/178 |
| 6,069,482 A * | 5/2000 | Hilton | | 324/755 |
| 6,323,661 B1 * | 11/2001 | Wildes et al. | | 324/719 |
| 6,607,394 B2 * | 8/2003 | Lindberg et al. | | 439/326 |
| 6,791,344 B2 * | 9/2004 | Cook et al. | | 324/754 |
| 7,271,606 B1 * | 9/2007 | Tang et al. | | 324/761 |
| 2003/0077391 A1 * | 4/2003 | Simons | | 427/384 |
| 2005/0127936 A1 * | 6/2005 | Chen | | 324/770 |
| 2005/0174136 A1 * | 8/2005 | Zhou et al. | | 324/761 |
| 2005/0258850 A1 * | 11/2005 | Yamada et al. | | 324/757 |

* cited by examiner

*Primary Examiner*—Ha Nguyen
*Assistant Examiner*—Arleen M Vazquez
(74) *Attorney, Agent, or Firm*—Brian M. Dingman; Mirick O'Connell DeMallie & Lougee, LLP

(57) ABSTRACT

A micro Kelvin probe assembly and method of accomplishing a micro Kelvin measurement that determines the resistance or impedance of a device under test (DUT) that has two spaced contacts. An ammeter is used to flow current through the DUT, and a voltmeter is used to measure the voltage drop across the DUT. There is a printed circuit board (PCB) carrying two pairs of contacts, with a trace leading to each contact. Anisotropic conductive elastomer (ACE) material as an electrical interposer is placed in electrical contact with each of the PCB contacts. The DUT is placed on the ACE such that each DUT contact is directly opposite one pair of PCB contacts. The ammeter is connected to one trace leading to one contact of each pair of PCB contacts to flow current through the DUT, and the voltmeter is connected to the other trace leading to the other contact of each pair of PCB contacts, so that voltmeter can measure the voltage drop across the DUT without an effect caused by the interposer.

6 Claims, 8 Drawing Sheets

CurrentLoop 1

Prior Art

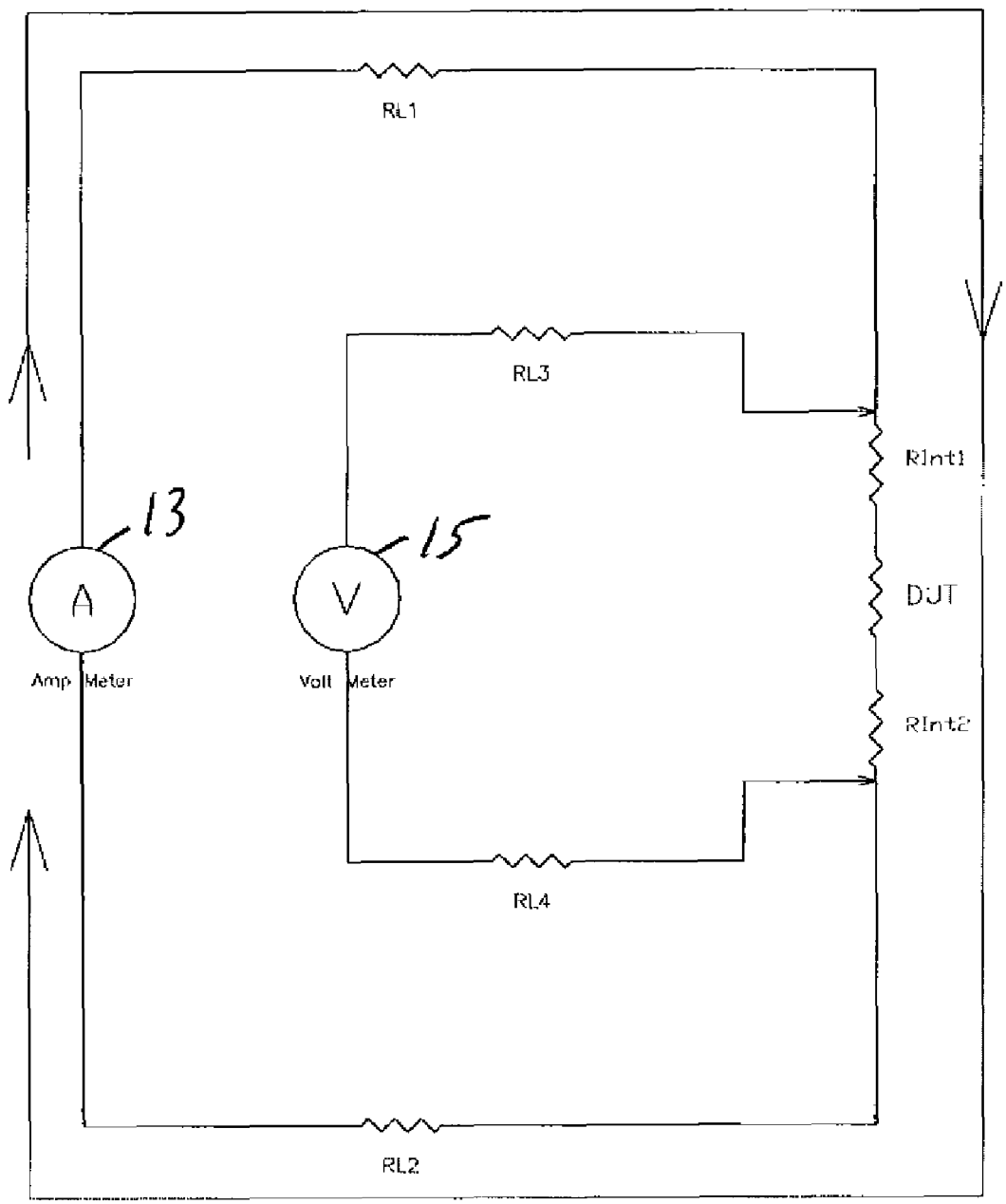
Prior Art

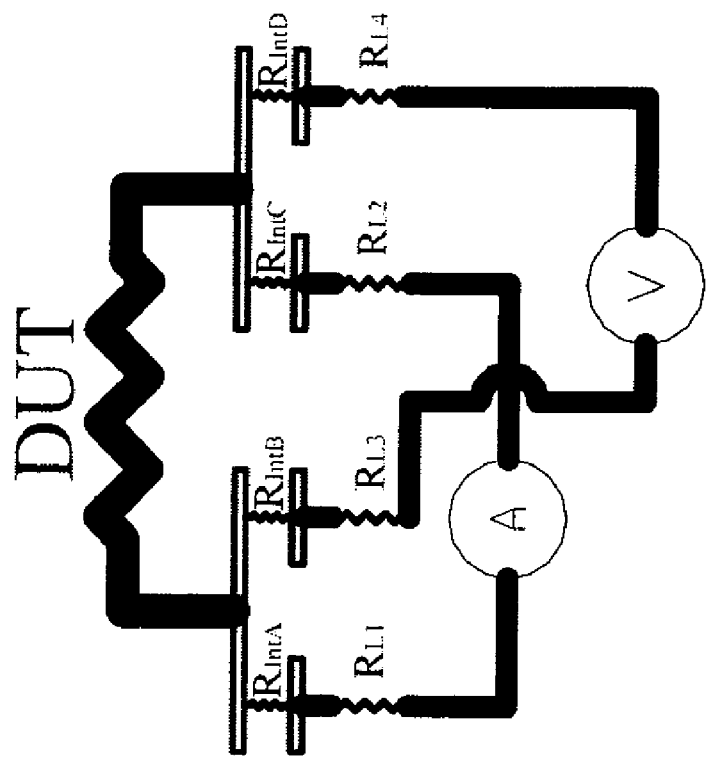
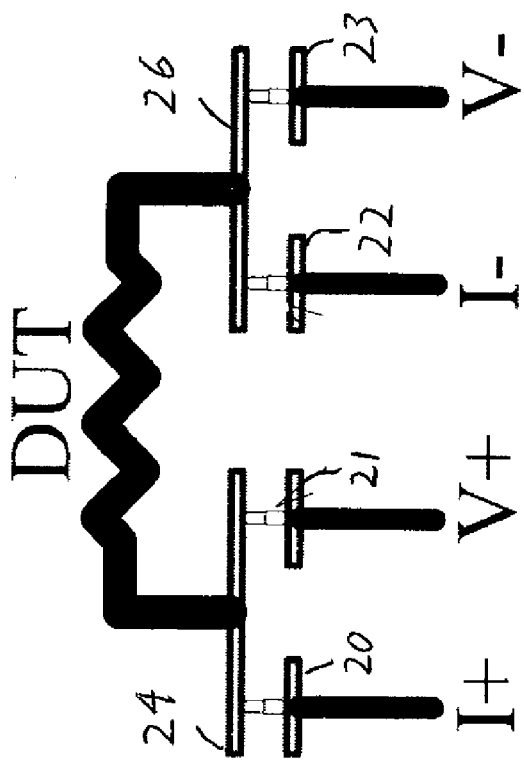
Fig. 4b
Fig. 4a
Prior Art

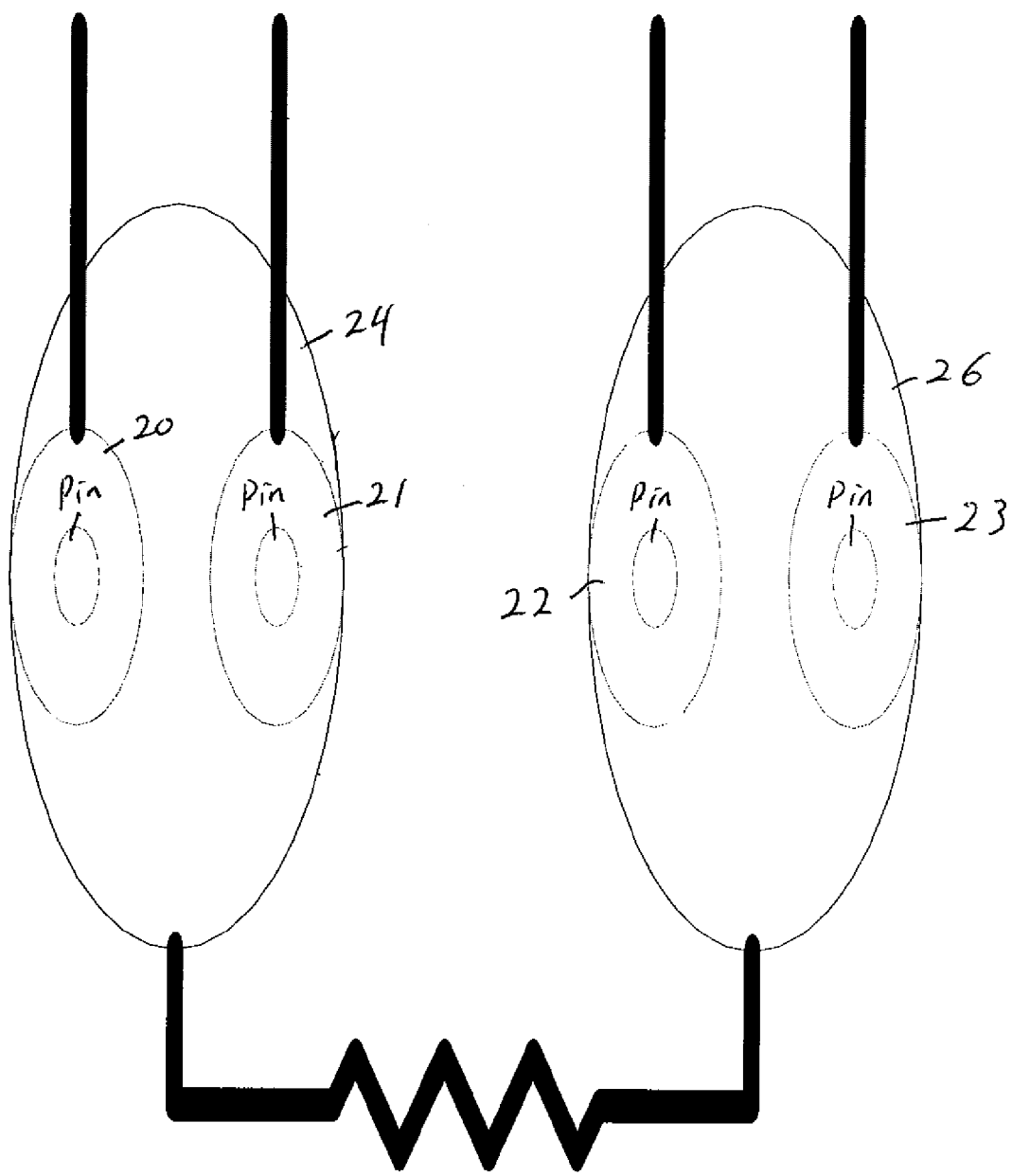

CurrentLoop 1

Prior Art

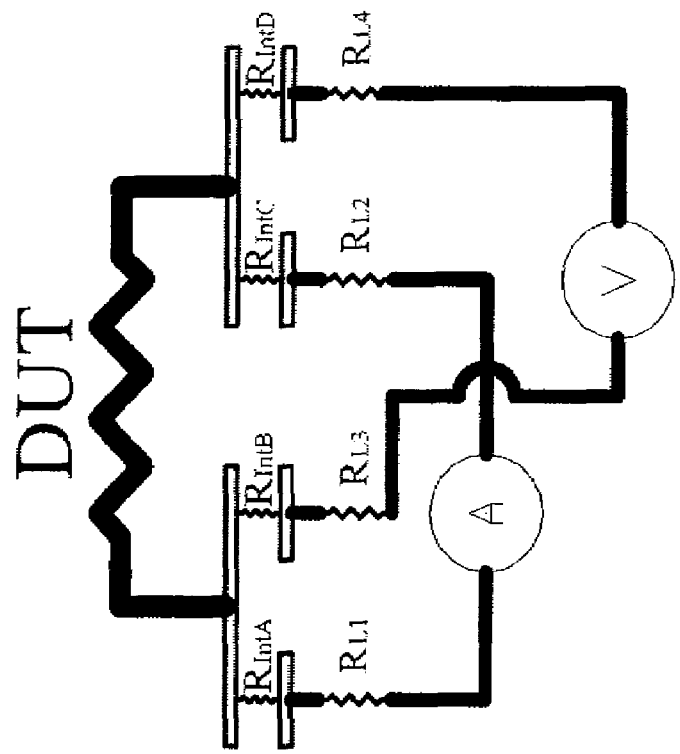
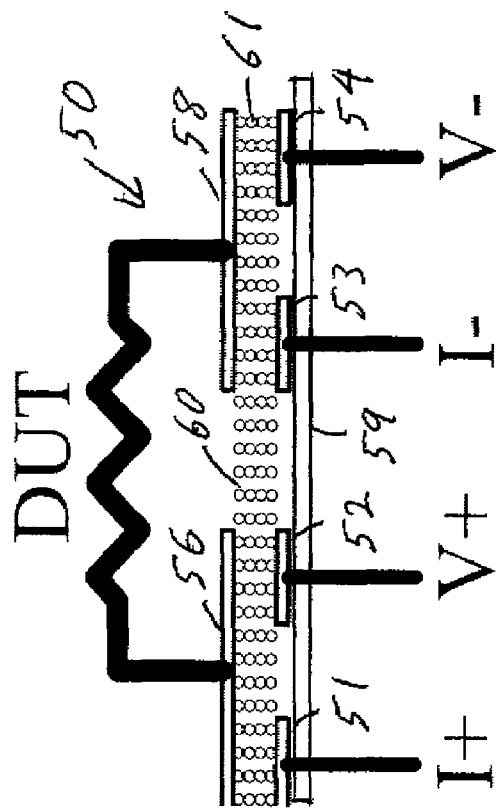
Fig. 7b
Fig. 7a ively large, with physical limitations (such as metal forming technologies and spring fabrication) that dictate their minimum size and thus dictate the contact pitch with which they can be used.

MICRO KELVIN PROBES AND MICRO KELVIN PROBE METHODOLOGY

CROSS REFERENCE TO RELATED APPLICATION

This application claims priority of provisional application Ser. No. 60/692,815 filed on Jun. 22, 2005, the disclosure of which is incorporated herein by reference.

FIELD OF THE INVENTION

This invention relates to a system and methodology for making resistance measurements of electrical devices.

BACKGROUND OF THE INVENTION

Kelvin measurement, also referred to as 4-wire measurement or remote voltage sense measurement, consists of measuring the resistance of a device under test (DUT) by inducing a known current flow into the DUT and reading the voltage drop remotely at the DUT. The accurate resistance measurement is then calculated from the separate voltage and current measurements using Ohms law, which is the ratio of voltage divided by resistance.

Refer to FIG. 1 for the following discussion of the manner in which Kelvin measurements are conducted. The current is provided to the DUT by two electrical leads, whose lead resistances are represented by RL1 and RL2. The ammeter can be modeled as a standalone current source. The current flowing through the RL1, RL2, and the DUT are all the same, as a result of these three devices being connected in series. The path of the current is represented by the line labeled "current loop 1."

The parallel resistance of the voltmeter connected to the DUT is many orders of magnitude higher than the DUT, and so near zero current will flow into the voltmeter. In typical real world applications, the relationship of voltmeter impedance to DUT resistance is about 10 GΩ to 100 mΩ, or a $10^{11}$ factor greater.

The two voltmeter electrical leads' resistances, which are represented by RL3, and RL4, can be neglected because of the near zero current flow into the voltage meter.

As mentioned above, an accurate resistance measurement is calculated from the separate voltage and current meter readings. In a Kelvin circuit, the current measurement accuracy is dominated by the accuracy of the ammeter, and the voltage measurement accuracy is dominated by the accuracy of the voltmeter.

In general, most DUT's measured with the Kelvin method are purely resistive; as a result the current induced into the circuit is a constant current from a DC source. However, there are instances where the device impedance is the measurement that is being sought. Because device impedance is a function of frequency, the current is generated from an AC source, at the required frequency.

Micro Kelvin measurements are instances where the DUT and/or DUT contact surfaces are too small to attach conventional meter probes to it. The current methods for making micro Kelvin measurements all have limitations.

One method of making micro Kelvin measurements can be termed a "double trace" method. There are two separate fine traces on the test printed circuit board, one for each of the two individual surface contacts (typically gold pads) on the board to which the DUT is mated via a temporary contact, called an "interposer." In FIG. 2a, ACE material 17 is illustrated as the interposer between the two interconnection surfaces (i.e. gold pads) 12, 14 on the surface of the board, and contacts 16, 18 of the DUT. FIG. 2b illustrates the electrical equivalent circuit formed by FIG. 2a. Ammeter 13 and voltmeter 15 are shown. The resistance of the ACE interposer has been represented by $R_{INT1}$, and $R_{INT2}$. The circuit of FIG. 2b has been redrawn in FIG. 3 to illustrate a flaw of this design. As seen in FIG. 3, the flaw that the resistances of the connector, represented as $R_{INT1}$, and $R_{INT2}$, add to the measurement of the DUT, because the voltage drop measurement is made at the outer nodes of the connector resistances. This introduces error.

A second method is termed a "double contact" method. See FIGS. 4a and 4b. There are four separate small contacts 20-23 on the surface of the test PCB (not shown), with a fine trace (not shown) leading to each contact. The two DUT interconnection surfaces or pads 24 and 26 are connected to pads 20, 21 and 22, 23, respectively, through a set of four separate mechanical contacts, one for each of contacts 20-23. These mechanical contacts can be spring-loaded pins or formed beam contacts; spring-loaded pins are shown in FIG. 4a. FIG. 4b illustrates the electrical equivalent circuit formed by FIG. 4a. The resistance of the contacts has been represented by $R_{INTA}$, $R_{INTB}$, $R_{INTC}$, and $R_{INTD}$. FIG. 5 is a top down view illustration of the relationship between all of the circuit elements of FIGS. 4a and b.

To illustrate the improvement of this method over the double trace method mentioned above, FIG. 4d has been redrawn in FIG. 6. The advantage is that the current from the ammeter still flows through the resistors $R_{INTA}$, DUT, and $R_{INTC}$ but now the voltage drop is measured across the nodes of the DUT. Also illustrated in FIG. 6 is that the contact resistances of $R_{INTB}$, and $R_{INTD}$ are now part of the lead resistance of the voltmeter. As mentioned above, because almost no current flows through the voltmeter, the resistances $R_{INTB}$, and $R_{INTD}$ are essentially irrelevant to the measurement.

The disadvantages of using the pins or formed contacts as interposers are:

Cost: Pin and formed contact technologies tend to be very expensive per interconnect, particularly with the fine pitches so prevalent today.

Inductance: Pin and formed contact technologies have high inductances at high frequencies, which is a problem when making Kelvin inductance measurements.

Inability to work at smaller pitches: Pin and formed contact technologies are physically relatively large, with physical limitations (such as metal forming technologies and spring fabrication) that dictate their minimum size and thus dictate the contact pitch with which they can be used.

Anisotropic Conductive Elastomer

Anisotropic Conductive Elastomer (ACE) is a composite of conductive metal elements in an elastomeric matrix that is normally constructed such that it conducts along one axis only. In general this type of material is made to conduct through its thickness. Anisotropic conductivity is achieved in one form of ACE by mixing magnetic particles with a liquid resin, forming the mix into a continuous sheet, and curing the sheet in the presence of a magnetic field. This results in the particles forming multiple separate but closely-spaced electrically conductive columns through the sheet thickness, each column separated from the others by cured insulating resin. Another group of ACE materials is constructed by embedding fine wire in a polymer matrix.

The resulting structure has the unique property of being both flexible and anisotropically conductive. These ACE materials can be constructed in large, continuous sheets, which can provide separable electrical interconnection over an extended area.

SUMMARY OF THE INVENTION

The present invention comprises a unique arrangement and method of using ACE material for high quality Kelvin electrical measurements in micro applications.

The present invention comprises the use of ACE material in a unique way that solves problems inherent in the current solutions.

This invention features a micro Kelvin probe assembly and method of accomplishing a micro Kelvin measurement that determines the resistance or impedance of a device under test (DUT) that has two spaced contacts using an ammeter to flow current through the DUT and a voltmeter to measure the voltage drop across the DUT. There is a printed circuit board (PCB) carrying two pairs of contacts, with a trace leading to each contact. Anisotropic conductive elastomer (ACE) material as an electrical interposer is placed in electrical contact with each of the PCB contacts. The DUT is placed on the ACE such that each DUT contact is directly opposite one pair of PCB contacts. The ammeter is connected to a trace leading to one contact of each pair of PCB contacts, and the voltmeter is connected to a trace leading to the other contact of each pair of PCB contacts, so that voltmeter can be used to measure the voltage drop across the DUT without an effect caused by the interposer. The ACE preferably comprises magnetically aligned particles in polymer material.

BRIEF DESCRIPTION OF THE DRAWINGS

Other objects, features and advantages will occur to those skilled in the art from the following description of the preferred embodiment and the accompanying drawings, in which:

FIG. 3 is a schematic circuit diagram illustrating the arrangement of FIGS. 2a and 2b;

FIGS. 4a and 4b are schematic mechanical and electrical diagrams, respectively, of another prior art micro Kelvin measurement arrangement;

FIG. 5 is a top schematic view of the arrangement of FIG. 4a;

FIGS. 7a and 7b are schematic mechanical and electrical diagrams, respectively, of the preferred embodiment of the micro Kelvin measurement arrangement for the invention; and FIG. 8 a top schematic view of the arrangement of FIG. 7a.

DESCRIPTION OF THE PREFERRED EMBODIMENT OF THE INVENTION

The invention incorporates the ability of today's advanced electronic circuit boards to route two separate fine traces for each contact of the DUT, where each separate trace terminates into its own interconnection surface (e.g. a gold pad). Two pads mate through an ACE interposer to each of the overlaying contacts of the DUT. The fine pitch of the ACE material, which can have columns on 0.1 mm centers or less, allows a simple, cost effective method of electrically connecting the DUT to the two sets of pads without the need for mechanical contacts.

Figure 8:
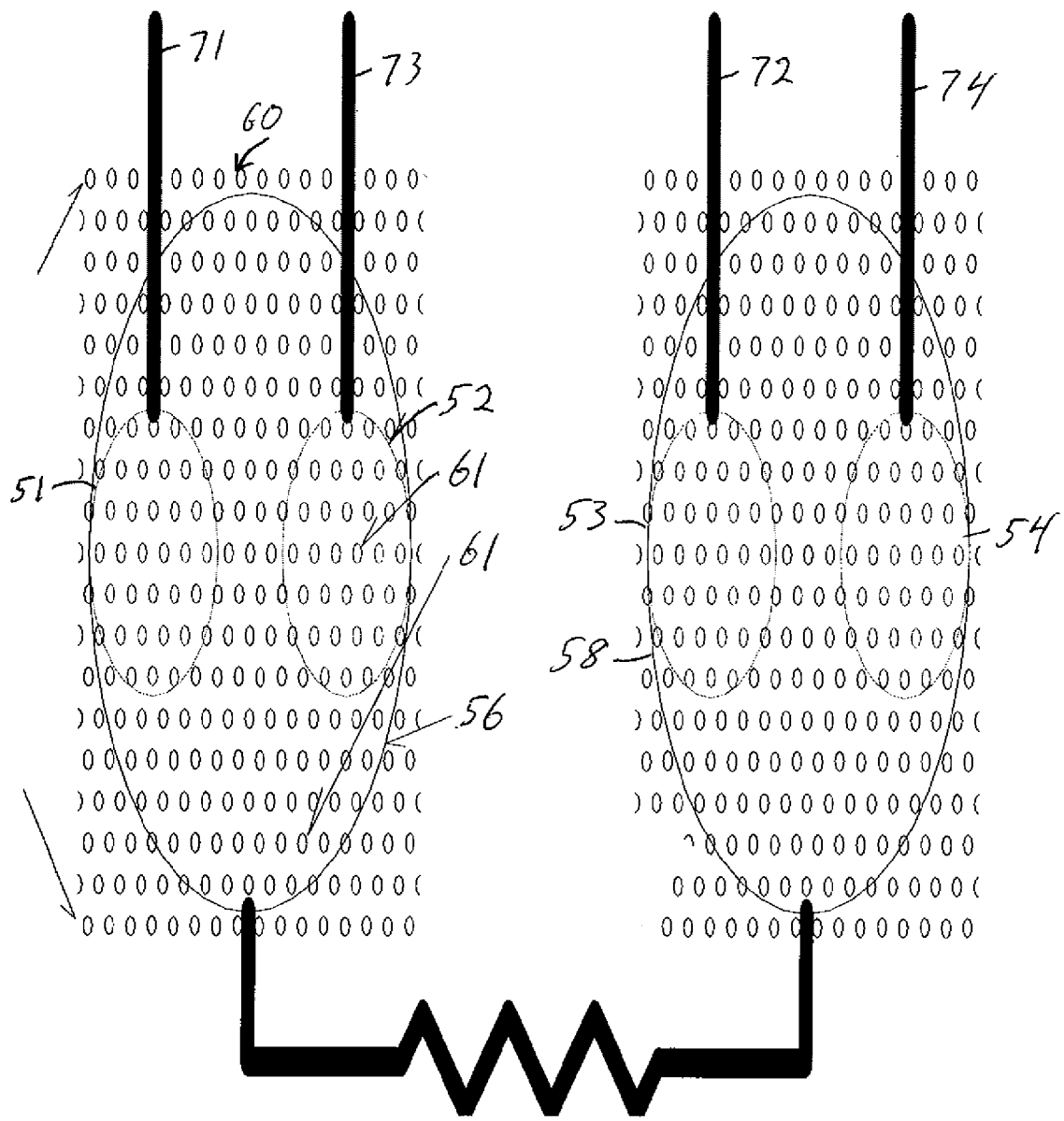

FIG. 7a shows assembly 50 according to this invention, representing the board pad to DUT pad relationship, along with the ACE interposer material. FIG. 8 is a top down view of the preferred embodiment. One set of pads 51 and 52 of board 59 is electrically connected to first DUT pad 56 by many of the closely-spaced conductive columns 61 of ACE material 60, while the second set of board pads 53 and 54 are similarly electrically connected by conductive columns 61 of ACE material 60 to second DUT pad 58. An ammeter is connected to pads 51 and 53 (or traces 71 and 72 of the PCB surface that lead to such pads), and a voltmeter is connected to pads 52 and 54 (or traces 73 and 74 of the PCB surface that lead to such pads).

Figure 1:
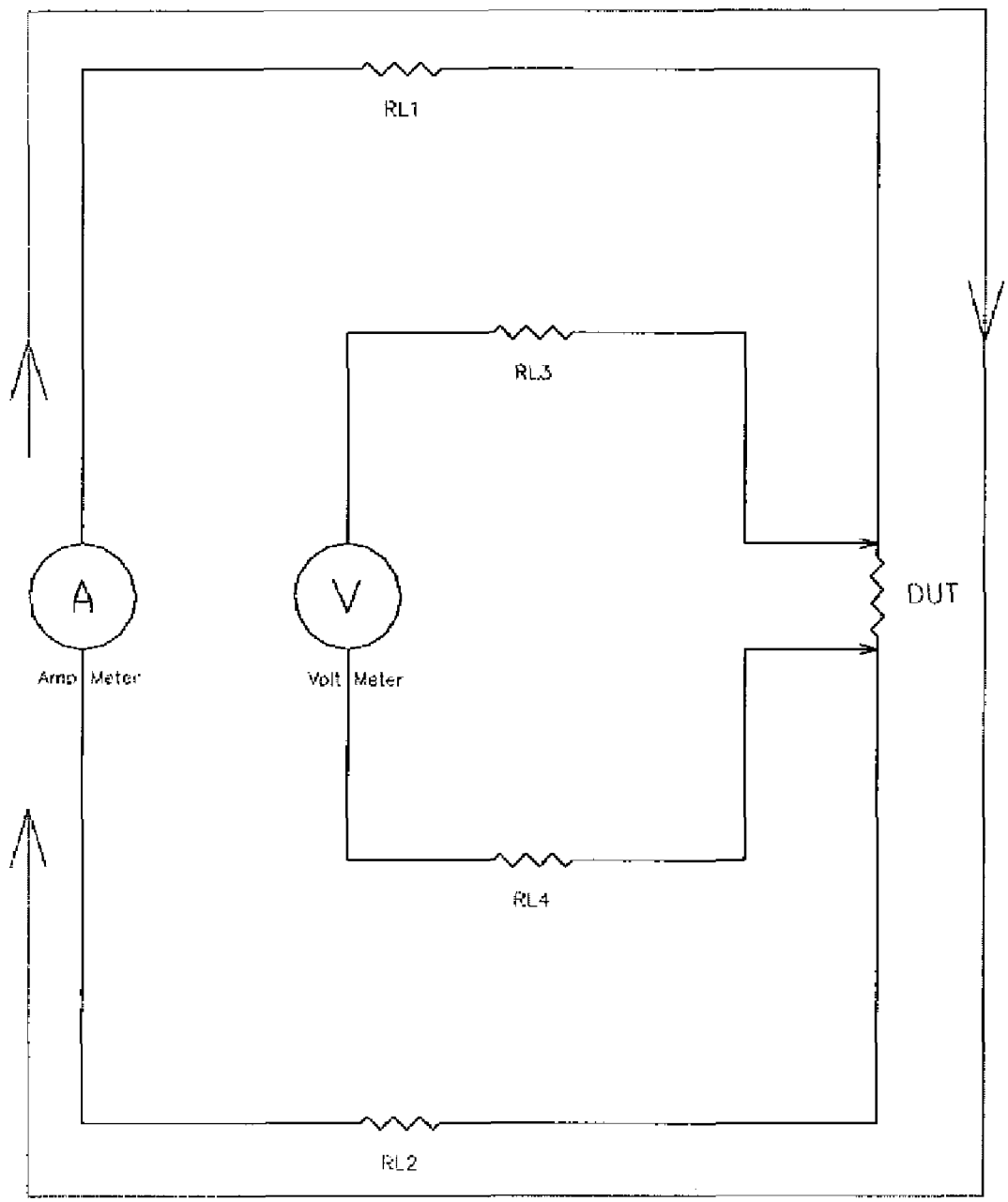
FIG. 1 is a schematic circuit diagram illustrating an ideal micro Kelvin measurement of the resistance of a DUT.
Figure 2B:
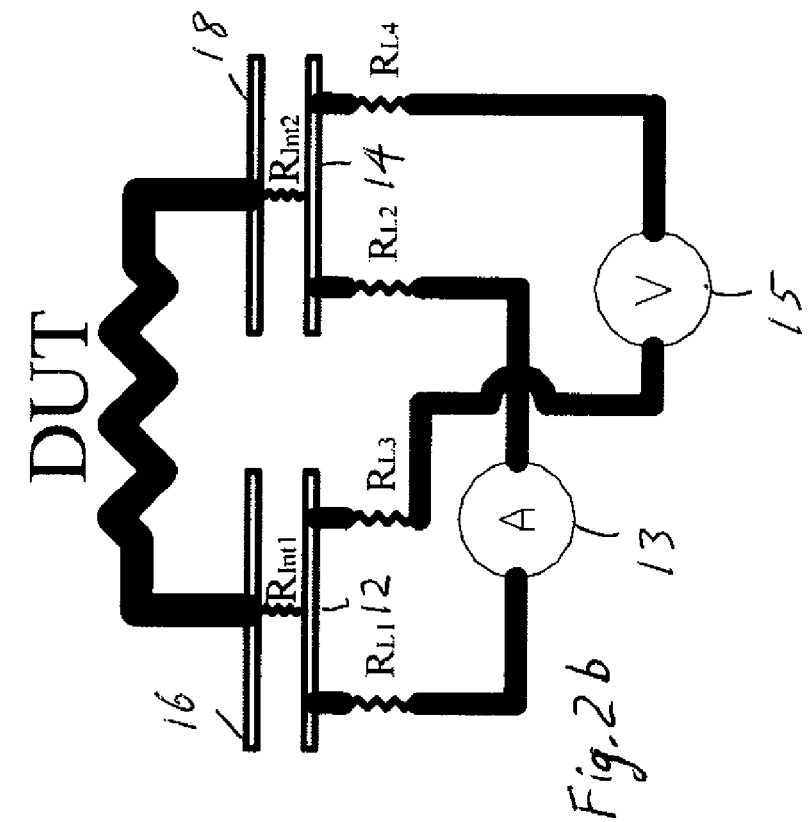
FIGS. 2a and 2b are schematic mechanical and electrical diagrams, respectively, of a prior art micro Kelvin measurement arrangement.
Figure 2A:
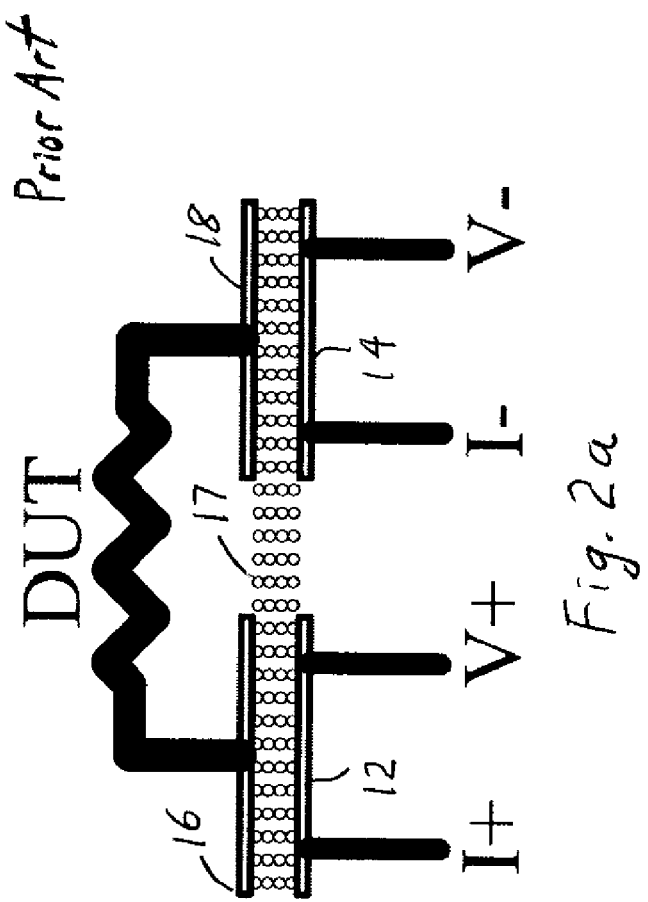
Figure 6:
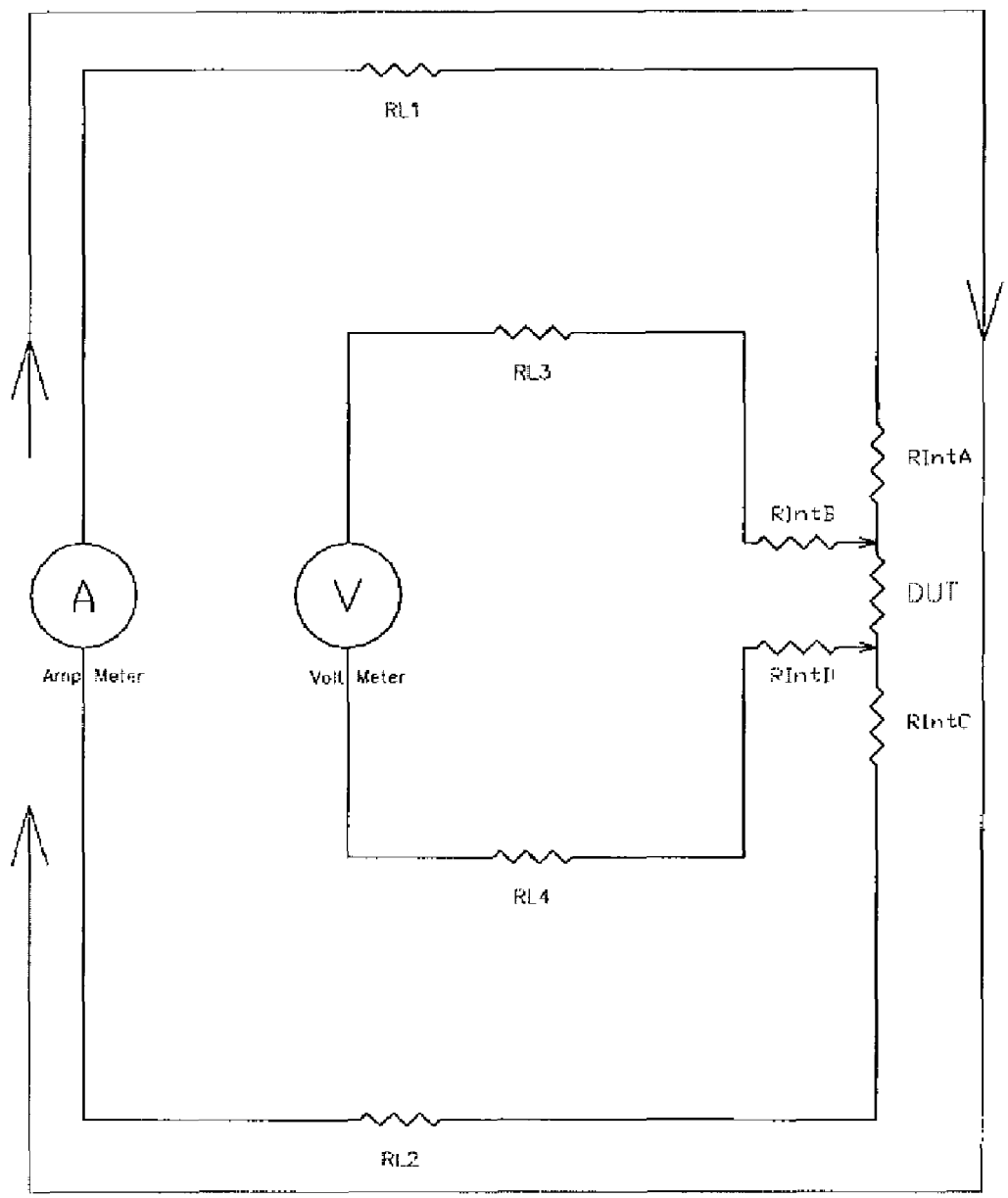
FIG. 6 is a schematic circuit diagram illustrating the arrangement of FIGS. 4a and 4b.

FIG. 7b illustrates the electrical equivalent circuit formed by the arrangement of FIG. 7a. The resistances of the many conductive columns of the ACE interconnections to each of the pads are represented by $R_{INTA}$, $R_{INTB}$, $R_{INTC}$, and $R_{INTD}$ in FIG. 7b. FIG. 7b has been redrawn in FIG. 6. FIG. 6 illustrates the advantage that the current from the ammeter still flows through the resistors $R_{INTA}$, DUT, and $R_{INTC}$ but now the voltage drop is measured across the nodes of the DUT. Also illustrated in FIG. 6 is that the interposer resistances of $R_{INTB}$, and $R_{INTD}$ are now part of the lead resistance of the voltmeter. As mentioned above, because near zero current flows through the voltmeter due to the voltmeter's impedance, the resistances $R_{INTB}$, and $R_{INTD}$ are irrelevant to the measurement.

The advantages of using ACE in a micro Kelvin measurement include:

Cost: The cost per contact is inherently low for ACE Material.

Near zero Inductance: ACE material far outperforms pins and formed contacts in that ACE material has a much higher bandwidth due to the low inductance and capacitance of ACE. This will be advantageous in Kelvin inductance measurements.

Pitch: Ability to accomplish separable electrical contact with low inductance and capacitance, at low cost, as the market moves toward smaller and smaller DUT and PCB pad pitch.

Although specific features of the invention are shown in some drawings and not others, this is for convenience only as the features may be combined in other manners in accordance with the invention. Other embodiments will occur to those skilled in the art and are within the following claims.

What is claimed is:

1. A micro Kelvin probe assembly for determining the resistance or impedance of a device under test (DUT) that has two spaced contacts, using an ammeter to flow current through the DUT and a voltmeter to measure the voltage drop across the DUT, the assembly comprising:

a printed circuit board (PCB) carrying two pairs of contacts;

anisotropic conductive elastomer (ACE) material as an electrical interposer in direct physical and electrical contact with each of the PCB two pairs of contacts;

wherein the DUT is placed on the ACE such that each DUT contact is directly opposite one pair of PCB contacts; and wherein the ammeter is connected to one contact of each pair of PCB contacts and flows current through the DUT, and the voltmeter is connected to the other contact of each pair of PCB contacts, so that voltmeter can be used to measure the voltage drop across the DUT without an effect caused by the interposer.

2. The assembly of claim 1 in which the ACE comprises conductive columns comprising magnetically aligned particles in polymer material.

3. The assembly of claim 2 in which the conductive columns are spaced apart from one another by no more than about 0.1 mm.

4. A method of using a micro Kelvin probe assembly to determine the resistance or impedance of a device under test (DUT) that has two spaced contacts, using an ammeter to flow current through the DUT and a voltmeter to measure the voltage drop across the DUT, the method comprising:
  providing a printed circuit board (PCB) carrying two pairs of contacts, with a trace leading to each contact;
  placing anisotropic conductive elastomer (ACE) material as an electrical interposer in direct physical and electrical contact with each of the PCB two pairs of contacts;
  placing the DUT on the ACE such that each DUT contact is directly opposite one pair of PCB contacts;
  connecting the ammeter to one contact of each pair of PCB contacts to flow current through the DUT; and
  connecting the voltmeter to the other contact of each pair of PCB contacts, so that voltmeter can be used to measure the voltage drop across the DUT without an effect caused by the interposer.

5. The method of claim 4 in which the ACE comprises conductive columns comprising magnetically aligned particles in polymer material.

6. The method of claim 5 in which the conductive columns are spaced apart from one another by no more than about 0.1 mm.

* * * * *